United States Patent
Takeuchi (10) Patent No.: US 8,611,160 B2
(45) Date of Patent: Dec. 17, 2013

(54) NONVOLATILE SEMICONDUCTOR STORAGE DEVICE AND DATA WRITE METHOD FOR THE SAME

(75) Inventor: Chihiro Takeuchi, Yokohama (JP)

(73) Assignee: Spansion LLC, Sunnyvale, CA (US)

( * ) Notice: Subject to any disclaimer, the term of this patent is extended or adjusted under 35 U.S.C. 154(b) by 258 days.

(21) Appl. No.: 13/158,179

(22) Filed: Jun. 10, 2011

(65) Prior Publication Data

US 2012/0099385 A1    Apr. 26, 2012

(30) Foreign Application Priority Data

Oct. 20, 2010    (JP) ................................. 2010-235689

(51) Int. Cl.
*G11C 7/10* (2006.01)

(52) U.S. Cl.
USPC ................................. 365/189.04; 365/189.12

(58) Field of Classification Search
USPC ........................................ 365/189.04, 189.12
See application file for complete search history.

(56) References Cited

U.S. PATENT DOCUMENTS

| | | | |
|---|---|---|---|
| 5,319,598 A * | 6/1994 | Aralis et al. | 365/189.12 |
| 6,163,485 A * | 12/2000 | Kawahara et al. | 365/185.24 |
| 6,567,313 B2 | 5/2003 | Tanaka et al. | |
| 8,374,023 B2 * | 2/2013 | An | 365/163 |

FOREIGN PATENT DOCUMENTS

| | | |
|---|---|---|
| JP | H07-122088 A | 5/1995 |
| JP | 2002-109894 A | 4/2002 |
| JP | 2006-085896 A | 3/2006 |

* cited by examiner

*Primary Examiner* — Pho M Luu
(74) *Attorney, Agent, or Firm* — Sterne, Kessler, Goldstein & Fox P.L.L.C.

(57) ABSTRACT

A nonvolatile semiconductor storage device includes an identification code generating circuit, a simultaneous write bit count calculation circuit, a write range calculation circuit, and a program pulse generating circuit. The identification code generating circuit generates an identification code to be assigned to every one of bits to be written, and the simultaneous write bit count calculation circuit calculates the number of bits to be written simultaneously, the number being equalized based on the generated identification code, within a range that does not exceed a maximum simultaneously writable bit number. The write range calculation circuit calculates a write range, based on the calculated number of bits to be written simultaneously, and the program pulse generating circuit generates a program pulse based on write data and on the generated identification code and the calculated write range.

14 Claims, 8 Drawing Sheets

NONVOLATILE SEMICONDUCTOR STORAGE DEVICE AND DATA WRITE METHOD FOR THE SAME

CROSS REFERENCE TO RELATED APPLICATION

This application is based upon and claims the benefit of priority of the prior Japanese Patent Application No. 2010-235689, filed on Oct. 20, 2010, the entire contents of which are incorporated herein by reference.

FIELD

The embodiments discussed herein are related to a nonvolatile semiconductor storage device and a data write method for the same.

BACKGROUND

In recent years, nonvolatile semiconductor storage devices such as flash memory have been used increasingly in a variety of electronic products. Writing data to such a nonvolatile semiconductor storage device is done in blocks of multiple bits or on a bit-by-bit basis.

More specifically, data is written to the nonvolatile semiconductor storage device by applying, for example, a voltage of about 5 V via the bit line; here, the maximum number of bits that may be written simultaneously (maximum simultaneously writable bit number) depends on the capability of the power supply circuit that generates the 5-V power.

Besides, between a 1-bit write operation in which one bit is written at a time and a 4-bit write operation in which four bits are written at a time, for example, there is a gap in the margin to be allowed for the capability of the power supply circuit.

When programming, there will be no problem as long as the write voltage applied to each memory cell is greater than a given threshold voltage but, when performing erasure thereafter, if the threshold voltage varies between memory cells, it will adversely affect the number of erasures.

In the related art, when writing data in blocks of multiple bits, if, for example, a fraction (remainder) is left after writing the multiple bits, the remaining bits representing the fraction are written at the end of the write process.

More specifically, when the maximum simultaneously writable bit number is 4, the data is first written in sequence in blocks of four bits, and then the remaining bits, if any, are written at the end of the write process.

That is, when the number of remaining bits is 3, these three bits are written at the end of the write process, likewise, when the number of remaining bits is 2, these two bits are written, and when the number of remaining bits is 1, this one bit is written.

However, when writing data in blocks of multiple bits, if the number of bits to be written simultaneously differs between write operations, the load applied to the power supply circuit varies. As a result, when performing erasure after programming, for example, the threshold voltage varies between memory cells, causing an ill effect on the number of erasures.

In an alternative design, the capacity of the power supply circuit (or the power supply section of the nonvolatile semiconductor storage device (memory macro)) has been increased to provide a greater margin in order to suppress the variation of the threshold voltage between memory cells.

In the related art, various designs have been proposed for nonvolatile semiconductor storage devices that perform simultaneous writing by controlling write pulses using a counter.

Patent Document 1: Japanese Laid-open Patent Publication No. 2006-085896
Patent Document 2: Japanese Laid-open Patent Publication No. 2002-109894
Patent Document 3: Japanese Laid-open Patent Publication No. H07-122088

SUMMARY

According to an aspect of the embodiments, a nonvolatile semiconductor storage device includes an identification code generating circuit, a simultaneous write bit count calculation circuit, a write range calculation circuit, and a program pulse generating circuit.

The identification code generating circuit generates an identification code to be assigned to every one of bits to be written, and the simultaneous write bit count calculation circuit calculates the number of bits to be written simultaneously, the number being equalized based on the generated identification code, within a range that does not exceed a maximum simultaneously writable bit number.

The write range calculation circuit calculates a write range, based on the calculated number of bits to be written simultaneously, and the program pulse generating circuit generates a program pulse based on write data and on the generated identification code and the calculated write range.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Figure 1:
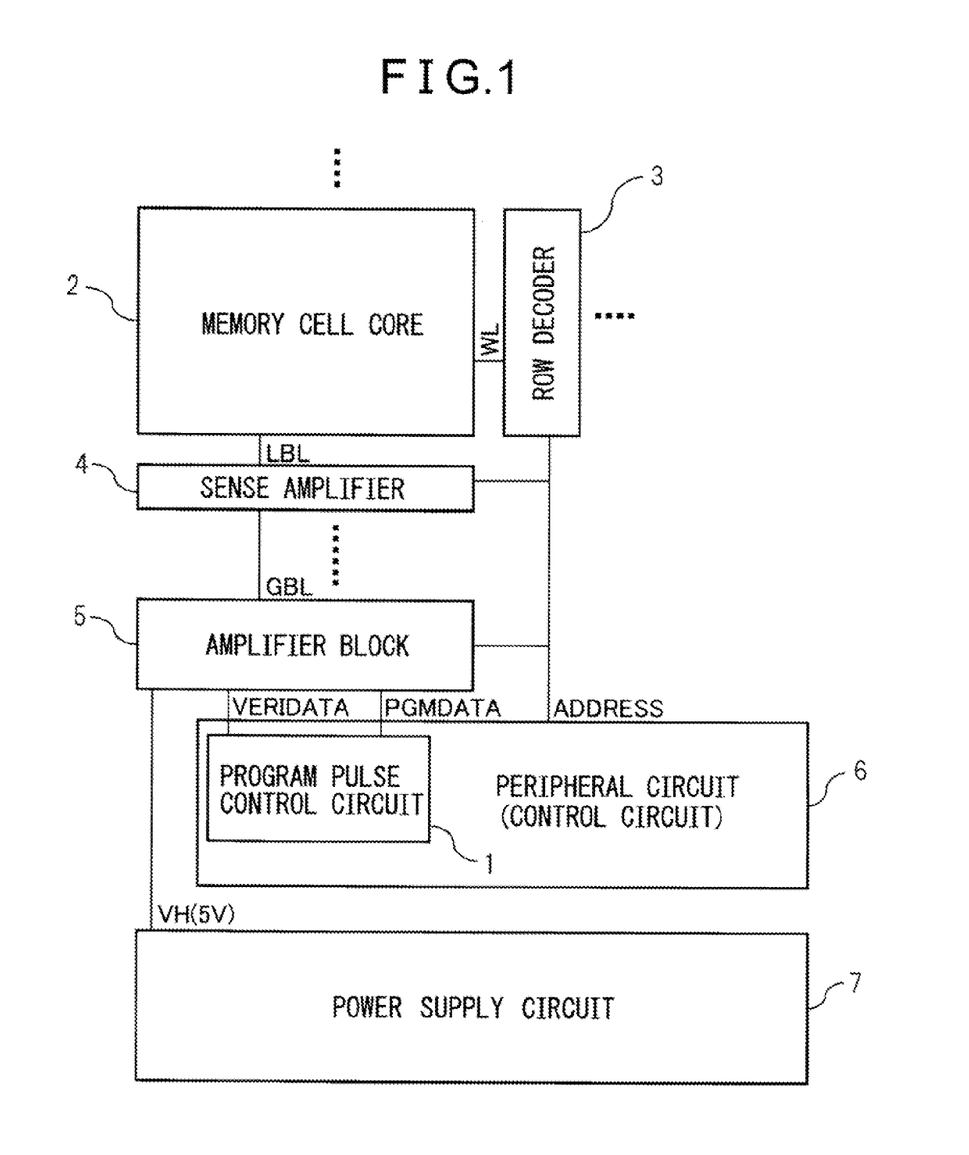
FIG. 1 is a block diagram illustrating the entire configuration of a nonvolatile semiconductor storage device according to one embodiment.

Embodiments of a nonvolatile semiconductor storage device and a data write method for the same will be described in detail below. FIG. 1 is a block diagram illustrating the entire configuration of a nonvolatile semiconductor storage device (memory macro) according to one embodiment, and FIG. 2 is a diagram illustrating one example of a memory cell core in the nonvolatile semiconductor storage device of FIG. 1.

In FIG. 1, reference numeral 1 is a program pulse control circuit, 2 is the memory cell core, 3 is a row decoder, 4 is a sense amplifier, 5 is an amplifier block, 6 is a peripheral circuit (control circuit), and 7 is a power supply circuit.

The program pulse control circuit 1, which is provided within the peripheral circuit 6, receives input data DATA-IN and verify data VERIDATA and outputs a program pulse (program data) PGMDATA, as will be described in detail later.

Figure 2:
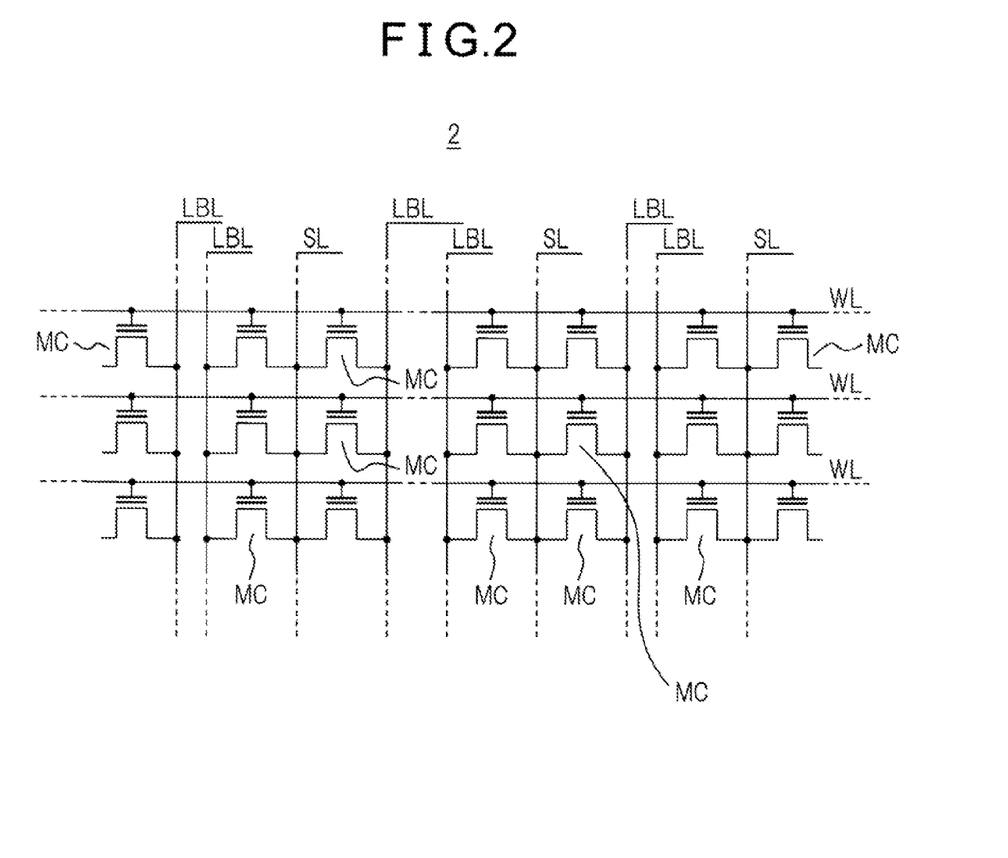
FIG. 2 is a diagram illustrating one example of a memory cell core in the nonvolatile semiconductor storage device of FIG. 1.

As illustrated in FIG. 2, the memory cell core 2 includes a plurality of local bit lines LBLs, a plurality of source lines SLs, a plurality of word lines WLs, and a plurality of memory cell transistors MCs.

The memory cells (memory cell transistors) MCs, each coupled to a corresponding one of the local bit lines LBLs, a corresponding one of the source lines SLs, and corresponding one of the word lines WLs, are arranged in a matrix array.

The row decoder 3 selects a particular word line WL in accordance with an address signal ADDRESS applied from the peripheral circuit 6, while the amplifier block 5 and sense amplifier 4 (column decoder) select a particular bit line (local bit line LBL) in accordance with the address signal ADDRESS.

That is, the sense amplifier 4 reads via the local bit line LBL the data stored in the memory cell MC selected by the word line WL, or performs write (program) and erase operations on the selected memory cell MC by applying a prescribed voltage to it.

On the other hand, the amplifier block 5 amplifies and controls the signals transferred between the memory cell core, via the sense amplifier 4, and the peripheral circuit 6 and power supply circuit 7. The sense amplifier 4 here controls the connection between the local bit line LBL and a global bit line GBL.

The peripheral circuit 7 generates control signals for the program pulse control circuit 1, the row decoder 3, the sense amplifier 4, and the amplifier block 5, respectively, and controls the read, write, verify, and erase operations performed on the memory cell core 2.

The power supply circuit 7, for example, generates 5-V power which is supplied via the local bit line LBL to the memory cell MC selected for writing (programming) in the memory cell core 2.

That is, the local bit line LBL via which the voltage VH (5-V power) generated by the power supply circuit 7 is to be supplied is selected based on the program pulse PGMDATA output from the program pulse control circuit 1 (peripheral circuit 6) and on the column (bit line) selected by the address ADDRESS.

Here, each memory cell MC has a floating gate and, to write data "0", the local bit line LBL coupled to the memory cell MC is driven, for example, to 5 V, and the word line WL is raised to 9 V, while holding the source line SL at 0 V.

In this write operation to the memory cell MC, since the data is written to the memory cell placed in the erased state, electric current flows from the local bit line LBL, on which the 5-V supply voltage is being applied, into the source line SL, and the power is thus consumed.

The nonvolatile semiconductor storage device depicted in FIG. 1 may be incorporated, for example, as a memory macro into a variety of semiconductor integrated circuits, but instead, it may be used by itself as a memory. Further, while only one memory cell core 2 is depicted in FIG. 1, it will be appreciated that a plurality of banks of such memory cell cores may be constructed.

Figure 3:
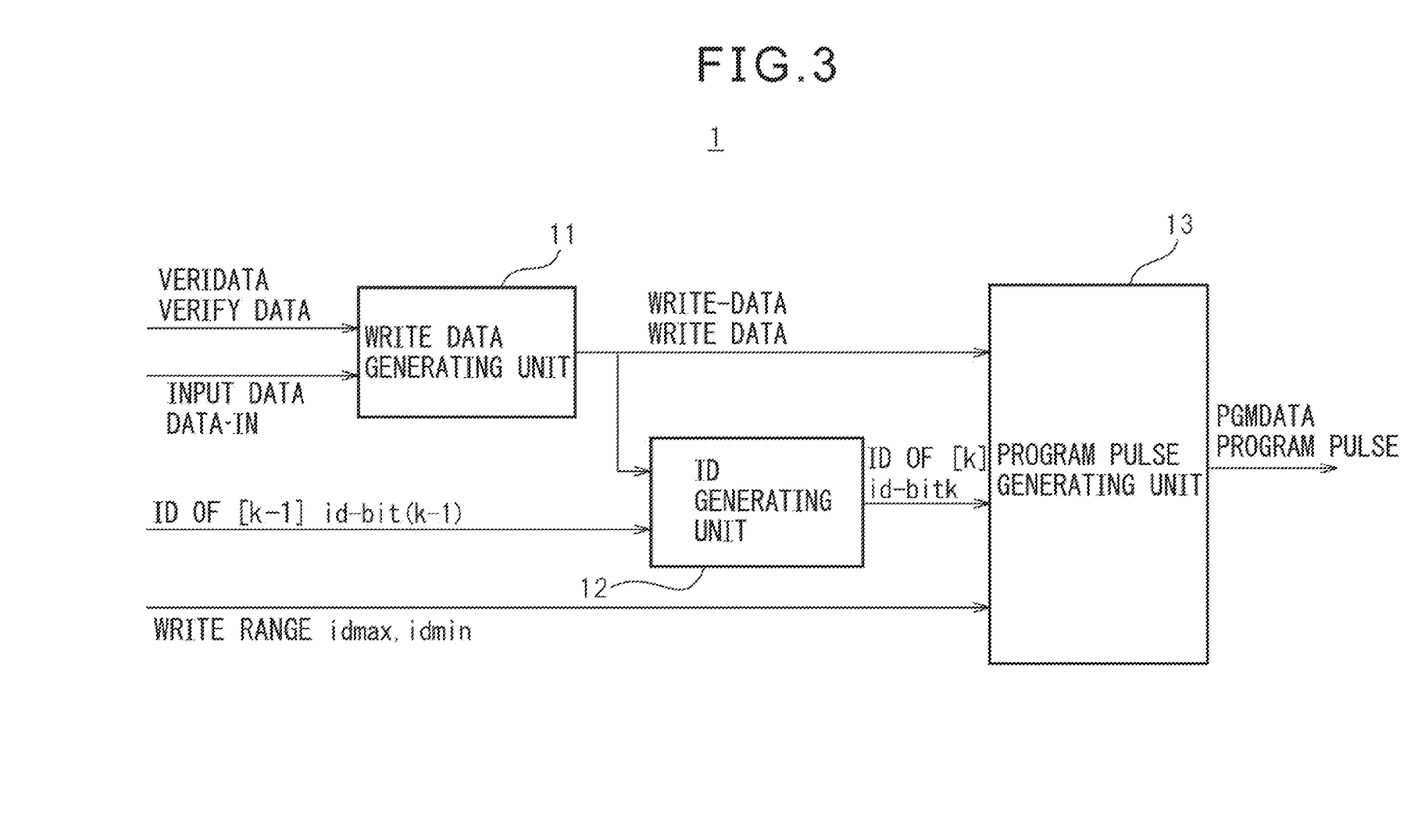
FIG. 3 is a block diagram schematically illustrating one example of a program pulse control circuit in the nonvolatile semiconductor storage device of FIG. 1.

FIG. 3 is a block diagram schematically illustrating one example of the program pulse control circuit in the nonvolatile semiconductor storage device of FIG. 1. As illustrated in FIG. 3, the program pulse control circuit 1 includes a write data generating unit 11, an ID (identification code) generating unit 12, and a program pulse generating unit 13.

The write data generating unit 11 receives input data DATA-IN and verify data VERIDATA, and generates write data WRITE-DATA. More specifically, the write data WRITE-DATA to the memory cell MC selected for writing continues to be generated until the verify data VERIDATA from that memory cell MC matches the input data DATA-IN thus rendering further writing (application of the program pulse) unnecessary.

The ID generating unit 12 receives the write data WRITE-DATA and the identification code (ID) of the immediately preceding bit, id-bit(k−1), and generates the identification code, id-bitk, for the current bit (k). In the case of the least significant bit (LSB[0]), "0" is taken as the identification code of the immediately preceding bit.

The program pulse generating unit 13 receives the write data WRITE-DATA, the identification code id-bitk, and the write range (idmax, idmin), and generates the program pulse PGMDATA for the memory cell MC selected for writing.

Figure 4:
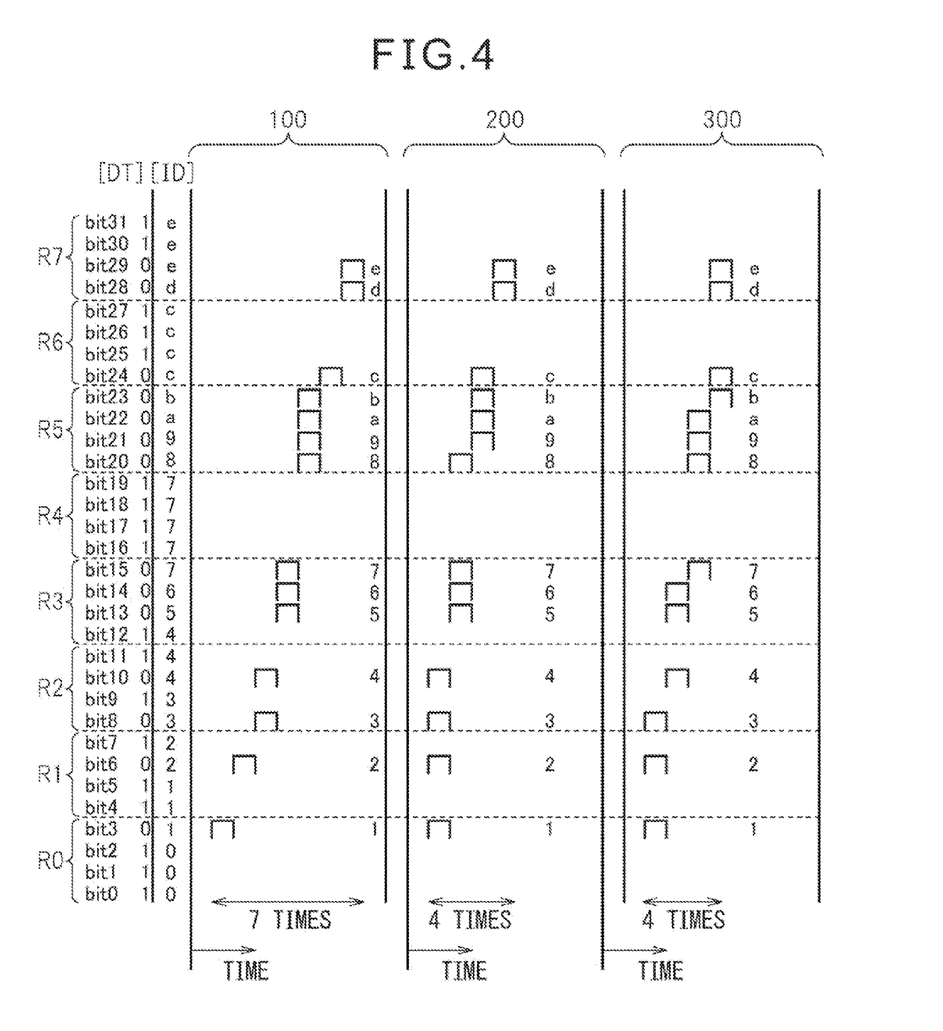
FIG. 4 is a diagram illustrating the operation of the program pulse control circuit of FIG. 3 for comparison with the related art.

FIG. 4 is a diagram illustrating the operation of the program pulse control circuit of FIG. 3 for comparison with the related art. In FIG. 4, reference numerals 100 and 200 each indicate the operation of a related art program pulse control circuit, and reference numeral 300 indicates the operation of the program pulse control circuit of FIG. 3.

In FIG. 4, the identification codes [ID] and write bits are indicated in hexadecimal notation; for example, the 10th to 14th bits (in decimal notation) to be actually written are designated as "a" to "e" in hexadecimal notation.

Further, as an example, it is assumed that the total number of bits to be written is 32 from bit 0 to bit 31, that the number of bits to be actually written with data is 14, and that the maximum number of bits that may be written simultaneously (maximum simultaneously writable bit number) is 4. Here, the maximum simultaneously writable bit number depends, for example, on the capacity of the power supply circuit, and represents the number of bits that may be written at once in a single write operation.

In FIG. 4, the write data is given as "32'hce0f1ab7". That is, FIG. 4 depicts the case in which the bits (whose [DT] is "0") to write data "0" to the memory cells MCs placed in the erased state "1" are the following 14 bits: bit 3, bit 6, bit 8, bit 10, bit 13, bit 14, bit 15, bit 20, bit 21, bit 22, bit 23, bit 24, bit 28, and bit 29.

First, as indicated at reference numeral 100, in one example of the related art program pulse control circuit operation, the 32-bit data to be written is divided into regions R0 to R7 of four bits each, and the data is sequentially written to the respective regions.

Here, in the write operation of the region R4, since the bits 16 to 19 contained in the region R4 are all is (data "0" is not written in this region), the write operation of the region R4 is skipped; therefore, a total of seven write operations are performed in the 4-bit regions.

More specifically, in the write operations of the regions R0, R1, and R6, only one bit is written in each region (bit 3, bit 6, and bit 24 are written in the respective regions), and in the write operations of the regions R2 and R7, two bits are simultaneously written in each region (bits 8 and 10 and bits 28 and 29 are written in the respective regions).

Further, in the write operation of the region R3, three bits (bit 13, bit 14 and bit 15) are simultaneously written, and in the write operation of the region R4, all the four bits (bit 20, bit 21, bit 22, and bit 23) are simultaneously written.

However, in the one example of the related art program pulse control circuit operation indicated at reference numeral 100, as many as seven write operations need to be performed, and besides, the number of bits to be written in a single write operation varies widely, ranging from the writing of only one bit to the writing of all the four bits.

Next, as indicated at reference numeral 200, in an alternative example of the related art program pulse control circuit operation, attention is given, among the 32 bits to be written, to the 14 bits to be actually written with data, and the 14 bits are written in blocks of four bits.

That is, regardless of the division of the 4-bit regions R0 to R7, groups each of four bits to be actually written with data are selected, starting from the least significant bit (LSB), and the thus selected groups are written in sequence.

More specifically, in the first write operation, the first four bits, bit 3, bit 6, bit 8, and bit 10, are simultaneously written, and in the second write operation, the second four bits, bit 13, bit 14, bit 15, and bit 20, are simultaneously written.

Further, in the third write operation, the third four bits, bit 21, bit 22, bit 23, and bit 24, are simultaneously written, and in the final or fourth write operation, the remaining bits, i.e., bit 28 and bit 29, are simultaneously written.

However, in this alternative example of the related art program pulse control circuit operation indicated at reference numeral 200, while the total number of write operations is reduced to 4, the number of bits to be written in a single write operation differs by 2 between the 4-bit write operation in each of the first to third write operations and the 2-bit write operation in the final or fourth write operation.

Here, if the number of bits to be actually written with data is 13, the difference in the number of bits to be written in a single write operation becomes greater because only one bit is written in the fourth write operation.

As described above, in the one example of the related art program pulse control circuit operation indicated at reference numeral 100, the time taken to write data increases because the number of write operations is large.

Furthermore, in both of the examples of the related art program pulse control circuit operation indicated at reference numerals 100 and 200, since the number of bits to be written simultaneously differs between the respective write operations, the load applied to the power supply circuit varies. As a result, when performing erasure after programming, for example, the threshold voltage varies between memory cells, causing an ill effect on the number of erasures.

By contrast, according to the program pulse control circuit of FIG. 3 (in the nonvolatile semiconductor storage device of the present embodiment) indicated at reference numeral 300, it becomes possible not only to reduce the total number of write operations to 4, but also to further reduce the difference in the number of bits to be written in a single write operation, that is, to only 1 between the 4-bit write operation and the 3-bit write operation.

As illustrated at reference numeral 300, in the operation of the program pulse control circuit of FIG. 3, attention is given, among the 32 bits to be written, to the 14 bits to be actually written with data. Then, the number, 14, of bits to be actually written is divided by 4 which is the number of bits that may be written simultaneously and, if there is a remainder, three bits are written simultaneously.

More specifically, first, 14÷4=3 with a remainder of 2, so that in the first write operation, three bits, i.e., bit 3, bit 6, and bit 8, are simultaneously written. Next, (14−3)÷4=2 with a remainder of 3, so that in the second write operation, three bits, i.e., bit 10, bit 13, and bit 14, are simultaneously written.

Further, (14−3−3)÷4=2 with a remainder of 0, so that in the third write operation, four bits, i.e., bit 15, bit 20, bit 21, and bit 22, are simultaneously written, and in the fourth write operation, four bits, i.e., bit 23, bit 24, bit 28, and bit 29, are simultaneously written.

In the above process, ID (identification code) is assigned to each of the bits 0 to 31 in accordance with the 14 bits to be actually written with data.

More specifically, "0" is assigned as ID to each of the first three bits, bit 0, bit 1, and bit 2, starting at the LSB position and ending at the bit position that precedes the bit position 3 at which the first data is written; next, "1" is assigned as ID to each of the next three bits, bit 3, bit 4, and bit 5, starting at the bit position 3 and ending at the bit position that precedes the bit position 6 at which the second data is written.

Further, "2" is assigned as ID to each of the two bits, bit 6 and bit 7, starting at the bit position 6 and ending at the bit position that precedes the bit position 8 at which the third data is written, and "3" is assigned as ID to each of the two bits, bit 8 and bit 9, starting at the bit position 8 and ending at the bit position that precedes the bit position 10 at which the fourth data is written.

In like manner, "c" is assigned as ID to each of the four bits, bit 24, bit 25, bit 26, and bit 27, starting at the bit position 24 at which the 12th data is written and ending at the bit position that precedes the bit position 28 at which the 13th data is written, and "d" is assigned as ID to bit 28, i.e., the bit in the bit position 28 that precedes the bit position 29 at which the 14th data is written. Finally, "e" is assigned as ID to each of the three bits, bit 29, bit 30, and bit 31, starting at the bit position 29 and ending at the MSB position.

By assigning ID to each bit as described above, and by performing processing based on the thus assigned ID by using a circuit to be described later, it becomes possible to implement the operation of the program pulse control circuit of FIG. 3 indicated at reference numeral 300.

In this way, according to the operation of the program pulse control circuit of FIG. 3 (in the nonvolatile semiconductor storage device of the present embodiment) indicated at reference numeral 300, the difference in the number of bits to be written in a single write operation may be reduced without incurring an increase in the number of write operations. This makes it possible to perform the write operations by equalizing the load without increasing the capacity of the power supply circuit.

Figure 5:
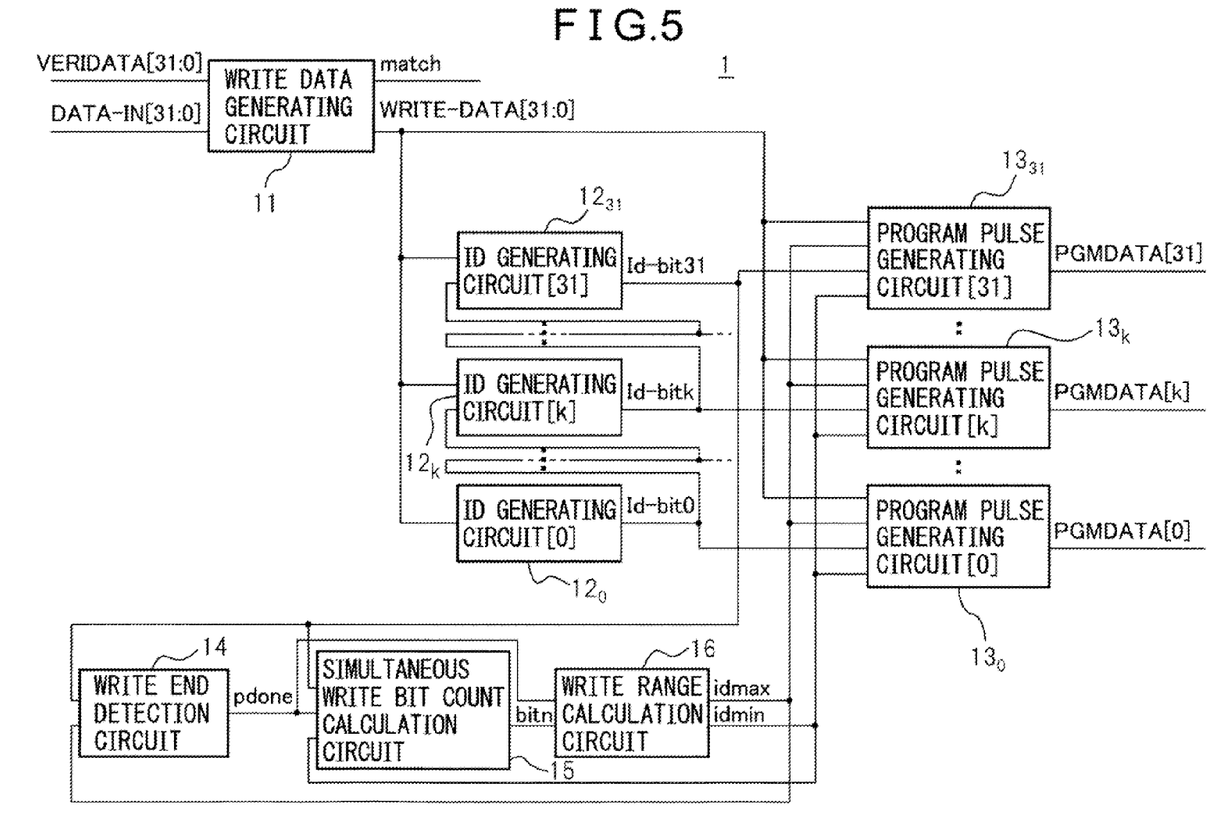
FIG. 5 is a block diagram illustrating in further detail the one example of the program pulse control circuit in the nonvolatile semiconductor storage device of FIG. 1.

FIG. 5 is a block diagram illustrating in further detail the one example of the program pulse control circuit in the nonvolatile semiconductor storage device of FIG. 1.

In FIG. 5, reference numeral 11 is a write data generating circuit, $12_0$ to $12_{31}$ are identification code generating circuits (ID generating circuits), $13_0$ to $13_{31}$ are program pulse generating circuits, and 14 is a write end detection circuit. Further, reference numeral 15 is a simultaneous write bit count calculation circuit, and 16 is a write range calculation circuit.

Here, the write data generating circuit 11 corresponds to the earlier described write data generating unit, and the ID generating circuits $12_0$ to $12_{31}$ and the program pulse generating circuits $13_0$ to $13_{31}$ correspond to the ID generating unit 12 and the program pulse generating unit 13, respectively.

As illustrated in FIG. 5, the program pulse control circuit 1 includes the write data generating circuit 11 and the 32 ID generating circuits $12_0$ to $12_{31}$ and 32 program pulse generating circuits $13_0$ to $13_{31}$ corresponding to the number of bits to be written.

The program pulse control circuit 1 further includes the write end detection circuit 14, the simultaneous write bit count calculation circuit 15, and the write range calculation circuit 16.

Figure 6:
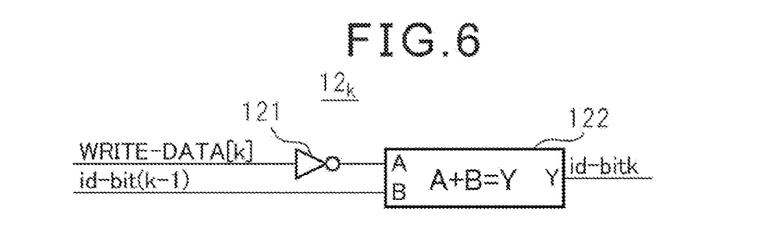
FIG. 6 is a block diagram illustrating one example of an ID generating circuit in the program pulse control circuit of FIG. 5.
Figure 7:
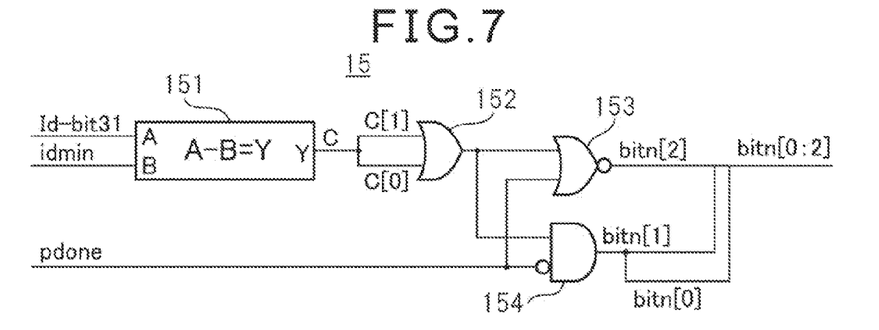
FIG. 7 is a block diagram illustrating one example of a simultaneous write bit count calculation circuit in the program pulse control circuit of FIG. 5.
Figure 8:
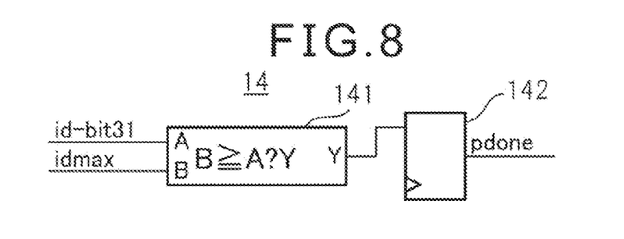
FIG. 8 is a block diagram illustrating one example of a write end detection circuit in the program pulse control circuit of FIG. 5.
Figure 9:
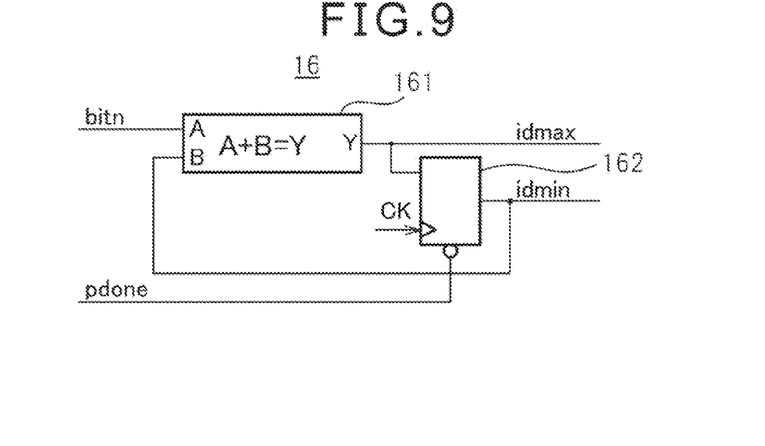
FIG. 9 is a block diagram illustrating one example of a write range calculation circuit in the program pulse control circuit of FIG. 5.
Figure 10:
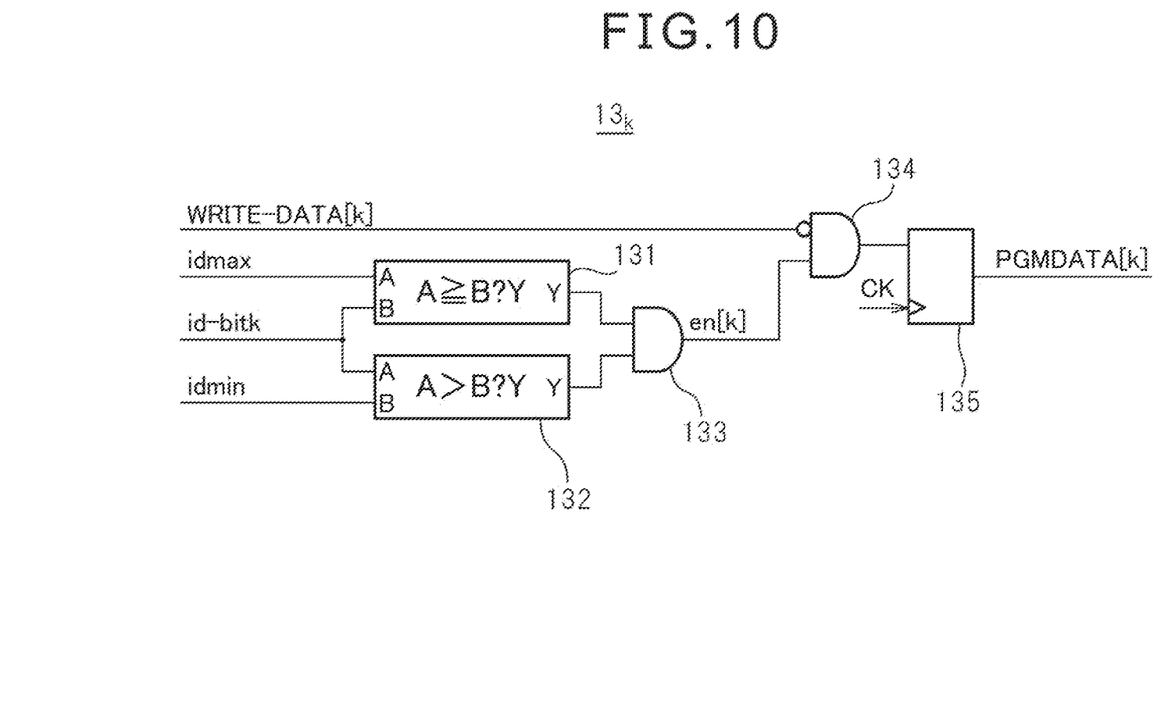
FIG. 10 is a block diagram illustrating one example of a program pulse generating circuit in the program pulse control circuit of FIG. 5.

FIG. 6 to FIG. 10 are diagrams illustrating examples of the respective circuits constituting the program pulse control circuit of FIG. 5. FIG. 6 depicts the ID generating circuit $12_k$ ($12_0$ to $12_{31}$), and FIG. 7 depicts the simultaneous write bit count calculation circuit 15. Further, FIG. 8 depicts the write end detection circuit 14, and FIG. 9 depicts the write range calculation circuit 16, while FIG. 10 depicts the program pulse generating circuit $13_k$ ($13_0$ to $13_{31}$).

Figure 11:
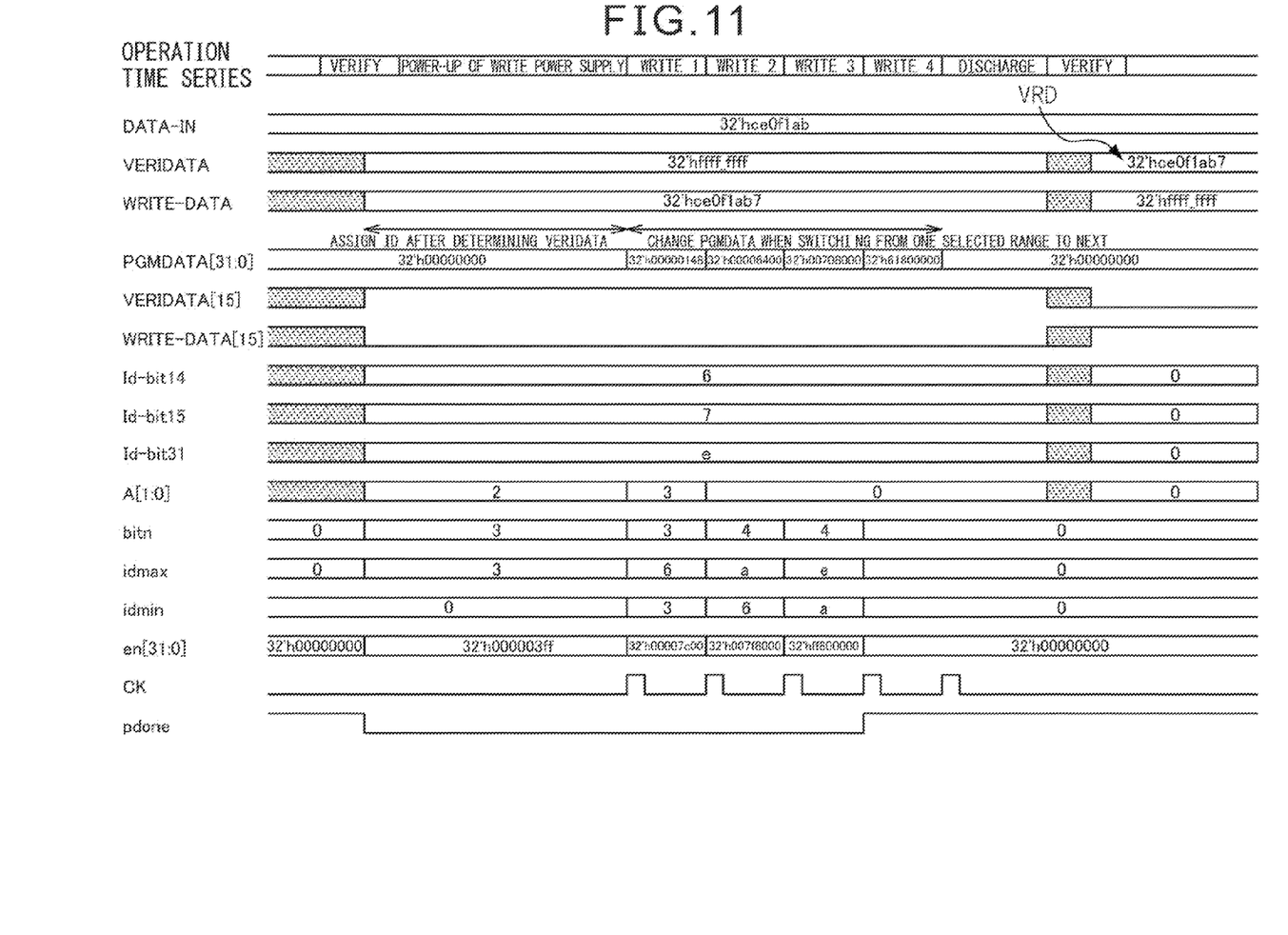
FIG. 11 is a timing diagram for explaining one example of the operation of the program pulse control circuit of FIG. 5.

FIG. 11 is a timing diagram for explaining one example of the operation of the program pulse control circuit of FIG. 5, which corresponds to the write operation indicated at reference numeral 300 in the previously given FIG. 4. That is, in FIG. 11 also, as in the previously given FIG. 4, the write data is given as "32'hce0f1ab7".

The write data generating circuit 11, which corresponds to the earlier described write data generating unit, receives, for example, input data DATA-IN [31:0] and verify data VERI-DATA [31:0] for the 32 bits to be written and generates write data WRITE-DATA [31:0].

As depicted in FIG. 6, the ID generating circuit $12_k$ includes an inverter 121 and an adder 122, and produces an output by inverting the WRITE-DATA [k] supplied from the write data generating circuit 11 and by adding the thus inverted signal to the output, id-bit(k−1), of the ID generating circuit $12_{k-1}$ provided for the immediately preceding bit.

Here, the WRITE-DATA [k] is a signal to be written as "0" and, when the write data WRITE-DATA (signal to be written as "0") is received, the ID generating circuit $12_k$ simply adds "1" to the identification code, id-bit(k−1), of the immediately preceding bit. The ID generating circuits $12_0$ to $12_{31}$ perform such calculations in a serial (sequential) manner.

With these calculations, the identification codes, id-bit0 to id-bit31 (IDs of bit 0 to bit 31), are given as "0" to "e", respectively, as previously described with reference to FIG. 4. More specifically, id-bit14 is given as "6", id-bit15 is given as "7", and id-bit31 is given as "e".

As depicted in FIG. 7, the simultaneous write bit count calculation circuit 15 includes an adder (subtractor) 151, an OR gate 152, a NOR gate 153, and an AND gate 154. Here, the ID (id-bit31) of the most significant bit is "e", and the write bit minimum ID (idmin) changes from "0" to "3" to "6" to "a" in this order, as illustrated in FIG. 11. The program end signal pdone remains at "0" during the write process.

The adder 151 subtracts idmin from id-bit31, and supplies the low-order two bits, C[0] and C[1], of its output C as inputs to the OR gate 152. Accordingly, the output bitn[2] of the NOR gate 153 remains at "1" and the output (bitn[0], bitn[1]) of the AND gate 154 also remains at "1" until the input signals C[1:0] to the OR gate 152 both become zero ("00"), that is, until the output of the adder 151 becomes equal to a multiple of 4.

The simultaneous write bit count calculation circuit 15 outputs a 3-bit signal bitn [2:0]. Then, as long as C [1:0] does not change to "00", bitn [2:0] is "011" which means that the simultaneous write bit count is "3", and when C [1:0] changes to "00", bitn [2:0] changes to "100" which means that the simultaneous write bit count is "4".

As a result, as illustrated in FIG. 11, in each of the first and second write operations (write 1 and write 2), three bits are written simultaneously, and in each of the third and fourth write operations (write 3 and write 4), four bits are written simultaneously.

Here, the numbers that may not be expressed by the combination of the simultaneous write bit counts "4" and "3" are {1, 2, 5}, and other numbers may be expressed by the combination of "4" and "3".

Accordingly, when the number of bits to be actually written with data is, for example, 14, 3-bit simultaneous writing is performed as long as there is a remainder and, when there is no longer any remainder, 4-bit simultaneous writing is performed.

More specifically, in the case of {5}, for example, since there is a remainder, 3-bit simultaneous writing is performed in the first write operation, and thereafter, the condition is the same as that in {2}.

Further, in the case of {1, 2}, for example, since there is a remainder, 3-bit simultaneous writing is performed, but since writing is not performed where there is no write data, one bit and two bits are simultaneously written, respectively, and thus the expected operation is achieved.

In the circuit illustrated above in FIG. 7, when the number of bits to be actually written with data is divided by 4, the remainder is simply given by the low-order two bits, eliminating the need for a subtractor circuit.

As depicted in FIG. 8, the write end detection circuit 14 includes a comparator 141 and a flip-flop 142. The comparator 141 compares the ID (id-bit31) of the most significant bit with the write bit maximum ID (idmax).

As illustrated in FIG. 11, idmax changes from "3" to "6" to "a" to "e" in this order. Here, the data to be written in the first write operation (write 1) is generated during the power-up period of the write power supply, and the data to be written in the second write operation (write 2) is generated during the period of write 1. Further, the data to be written in the third write operation (write 3) is generated during the period of write 2, and the data to be written in the fourth write operation (write 4) is generated during the period of write 3.

Then, upon detecting that idmax has become equal to or larger than id-bit31 (idmax≥id-bit31), the comparator 141 outputs a signal "1", which causes the output signal (program end signal) pdone of the flip-flop 142 to change to "1", whereupon the write process is terminated.

As depicted in FIG. 9, the write range calculation circuit 16 includes an adder 161 and a flip-flop 162. The adder 161 takes as inputs the output bitn of the simultaneous write bit count calculation circuit 15 and the output (idmin) of the flip-flop 162, and outputs their sum as the write bit maximum ID (idmax) which is also supplied to the data input of the flip-flop 162.

That is, the write range calculation circuit 16 receives the 3-bit signal bitn [2:0] from the simultaneous write bit count calculation circuit 15, and outputs the write range (idmin, idmax) by generating it in accordance with the simultaneous write bit count (3 or 4 bits). The program end signal pdone is applied to the reset terminal of the flip-flop 162.

Thus, idmin changes from "0" to "3" to "6" to "a" as idmax changes from "3" to "6" to "a" to "e", as illustrated in FIG. 11.

As depicted in FIG. 10, the program pulse generating circuit $13_k$ includes comparators 131 and 132, AND gates 133 and 134, and a flip-flop 135. The comparator 131 takes as inputs the write bit maximum ID (idmax) and the ID (id-bitk) of bit k, while the comparator 132 takes as inputs the write bit minimum ID (idmin) and the ID (id-bitk) of bit k.

Then, the comparator 131 outputs "1" when id-bitk is not larger than idmax (idmax≥id-bitk), and the comparator 132 outputs "1" when id-bitk is larger than idmin (id-bitk>idmin). The outputs of the comparators 131 and 132 are supplied to the AND gate 133 which, when these outputs are both "1", outputs "1" as a write enable en[k] for bit k.

The AND gate 134 receives the write data WRITE-DATA [k] for bit k at its inverting input terminal and the write enable en[k] at its noninverting input terminal, and outputs "1" when WRITE-DATA [k] is "0" and en[k] is "1". The write data WRITE-DATA [k] for bit k is written when the data is "0".

Then, when the id-bitk of bit k is contained in the write range bounded by idmax and idmin, and when the data is to be written into bit k, the flip-flop 135 outputs the program pulse PGMDATA [k] in response to clock CK.

Thus, in the first to fourth write operations (write 1 to write 4), the program pulse PGMDATA [31:0] changes from "32'h00000148" to "32'h00006400" to "32'h00708000" to "32'h61800000" in this order, as illustrated in FIG. 11.

In FIG. 11, when the verify data VERIDATA from the memory cell MC selected for writing matches the write data "32'hce0f1ab7", as indicated, for example, by reference character VRD, the data write to the memory cell MC ends.

In the program pulse control circuit 1, it will be appreciated that the ID generating circuit $12_k$, the simultaneous write bit count calculation circuit 15, the write end detection circuit 14, the write range calculation circuit 16, and the program pulse generating circuit $13_k$, described above, are only example and may be modified in various ways.

As described above, according to the present embodiment, after determining the write data, ID is assigned to every one of the bits to be written and, by selecting the ID, control is performed on the bits to be written simultaneously.

That is, by controlling the program (write) pulse by selecting the ID within a range that does not exceed the maximum simultaneously writable bit number, it becomes possible not only to reduce the calculation loss during the switching, thus reducing the program pulse application time, but also to equalize the number of bits to be written simultaneously.

This makes it possible to perform the write operations by equalizing the load without increasing the capacity of the power supply circuit. It also becomes possible to suppress the variation of the threshold voltage between memory cells.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A nonvolatile semiconductor storage device comprising:
   an identification code generating circuit configured to generate an identification code to be assigned to every one of bits to be written;
   a simultaneous write bit count calculation circuit configured to calculate the number of bits to be written simultaneously, the number being equalized based on the generated identification code, within a range that does not exceed a maximum simultaneously writable bit number;
   a write range calculation circuit configured to calculate a write range, based on the calculated number of bits to be written simultaneously; and
   a program pulse generating circuit configured to generate a program pulse based on write data and on the generated identification code and the calculated write range.

2. The nonvolatile semiconductor storage device as claimed in claim 1, wherein
   the identification code generating circuit and the program pulse generating circuit are provided for each one of the bits to be written, and
   the identification code generating circuit outputs "0" as the identification code for a least significant bit, increments the identification code by "1" for each bit to be actually written with data, and outputs the thus incremented code as the identification code for each corresponding bit.

3. The nonvolatile semiconductor storage device as claimed in claim 1, wherein
   when the number of bits to be actually written with data is divided by the maximum simultaneously writable bit number, if there is a remainder, the simultaneous write bit count calculation circuit outputs a value representing a prescribed number of bits that is equalized so as to be smaller than the maximum simultaneously writable bit number, and
   when the number of bits to be actually written with data is divided by the maximum simultaneously writable bit number, if there is no remainder, the simultaneous write bit count calculation circuit outputs a value representing a number equal to the maximum simultaneously writable bit number.

4. The nonvolatile semiconductor storage device as claimed in claim 3, wherein
   the maximum simultaneously writable bit number is 4, and wherein
   when the number of bits to be actually written with data is divided by the maximum number, 4, of bits that may be written simultaneously, if there is a remainder, the simultaneous write bit count calculation circuit outputs a value representing 3 as the prescribed number of bits, and
   when the number of bits to be actually written with data is divided by the maximum number, 4, of bits that may be written simultaneously, if there is no remainder, the simultaneous write bit count calculation circuit outputs a value representing 4 equal to the maximum simultaneously writable bit number.

5. The nonvolatile semiconductor storage device as claimed in claim 4, wherein the simultaneous write bit count calculation circuit, based on the value of low-order two bits of the number of bits to be actually written with data, determines whether or not there is a remainder when the number of bits to be actually written with data is divided by the maximum number, 4, of bits that may be written simultaneously.

6. The nonvolatile semiconductor storage device as claimed in claim 5, wherein after performing processing for simultaneous writing of three bits because of the presence of a remainder when the number of bits to be actually written with data is divided by the maximum number, 4, of bits that may be written simultaneously, the simultaneous write bit count calculation circuit, based on the value of low-order two bits of the number of bits remaining after subtracting 3 from the number of bits to be actually written with data, determines whether or not there is a remainder when the number of bits remaining after subtracting 3 from the number of bits to be actually written with data is divided by the maximum number, 4, of bits that may be written simultaneously.

7. The nonvolatile semiconductor storage device as claimed in claim 1, further comprising a write end detection circuit configured to detect a write end when a write bit maximum value, output from the write range calculation circuit, is larger than the identification code of the most significant bit to be written.

8. A write control method for a nonvolatile semiconductor storage device, comprising:
generating an identification code to be assigned to every one of bits to be written;
calculating the number of bits to be written simultaneously, the number being equalized based on the generated identification code, within a range that does not exceed a maximum simultaneously writable bit number;
calculating a write range, based on the calculated number of bits to be written simultaneously; and
performing simultaneous writing by generating a program pulse based on write data and on the generated identification code and the calculated write range.

9. The write control method for the nonvolatile semiconductor storage device as claimed in claim 8, wherein
the identification code and the program pulse are generated for each one of the bits to be written, and
generating the identification code includes outputting "0" as the identification code for a least significant bit, incrementing the identification code by "1" for each bit to be actually written with data, and outputting the thus incremented code as the identification code for each corresponding bit.

10. The write control method for the nonvolatile semiconductor storage device as claimed in claim 8, wherein
when the number of bits to be actually written with data is divided by the maximum simultaneously writable bit number, if there is a remainder, a prescribed number of bits that is equalized so as to be smaller than the maximum simultaneously writable bit number is taken as the number of bits to be written simultaneously, and
when the number of bits to be actually written with data is divided by the maximum simultaneously writable bit number, if there is no remainder, the maximum simultaneously writable bit number is taken as the number of bits to be written simultaneously.

11. The write control method for the nonvolatile semiconductor storage device as claimed in claim 10, wherein
the maximum simultaneously writable bit number is 4, and wherein
when the number of bits to be actually written with data is divided by the maximum number, 4, of bits that may be written simultaneously, if there is a remainder, the prescribed number of bits that is equalized to 3 is taken as the number of bits to be written simultaneously, and
when the number of bits to be actually written with data is divided by the maximum number, 4, of bits that may be written simultaneously, if there is no remainder, the maximum number, 4, of bits that may be written simultaneously is taken as the number of bits to be written simultaneously.

12. The write control method for the nonvolatile semiconductor storage device as claimed in claim 11, wherein when calculating the number of bits to be written simultaneously, a determination as to whether or not there is a remainder when the number of bits to be actually written with data is divided by the maximum number, 4, of bits that may be written simultaneously is made based on the value of low-order two bits of the number of bits to be actually written with data.

13. The write control method for the nonvolatile semiconductor storage device as claimed in claim 12, wherein after performing processing for simultaneous writing of three bits because of the presence of a remainder when the number of bits to be actually written with data is divided by the maximum number, 4, of bits that may be written simultaneously, a determination as to whether or not there is a remainder when the number of bits remaining after subtracting 3 from the number of bits to be actually written with data is divided by the maximum number, 4, of bits that may be written simultaneously is made based on the value of low-order two bits of the number of bits remaining after subtracting 3 from the number of bits to be actually written with data.

14. The write control method for the nonvolatile semiconductor storage device as claimed in claim 8, further comprising detecting a write end when a write bit maximum value, obtained by the calculation of the write range, is larger than the identification code of the most significant bit to be written.

* * * * *